(12) United States Patent
Ratajczak et al.

(10) Patent No.: US 6,191,591 B1
(45) Date of Patent: Feb. 20, 2001

(54) BATTERY CELL GRADING HOLDER

(75) Inventors: Joseph S. Ratajczak; Harold T. Coyle, both of El Paso, TX (US); Danny F. Rockett, Gainesville, GA (US); Julio Delgado, Apex, NC (US)

(73) Assignee: Moltech Power Systems, Inc., Gainesville, FL (US)

( * ) Notice: Under 35 U.S.C. 154(b), the term of this patent shall be extended for 0 days.

(21) Appl. No.: 09/087,550

(22) Filed: May 29, 1998

(51) Int. Cl.[7] .............................. G01N 27/416; H02J 7/00
(52) U.S. Cl. ........................ 324/437; 324/434; 320/122
(58) Field of Search .................................. 324/434, 435, 324/437, 450; 429/90–93, 100, 6, 7, 97–99, 61, 62; 320/116, 156, 161, 162, 122

(56) References Cited

U.S. PATENT DOCUMENTS

| | | |
|---|---|---|
| 705,919 | 7/1902 | Gill . |
| 1,102,355 | 7/1914 | Rawson et al. . |
| 3,454,859 * | 7/1969 | Ford et al. .............................. 320/118 |
| 3,586,962 * | 6/1971 | Rebstock .............................. 324/434 |
| 3,735,310 * | 5/1973 | Kochanski ............................. 337/107 |
| 3,887,393 * | 6/1975 | La Rue, Jr. .............................. 429/99 |
| 4,081,743 | 3/1978 | Madden . |
| 4,198,597 * | 4/1980 | Sawyer ................................. 324/434 |

FOREIGN PATENT DOCUMENTS

WO 88/04776 * 6/1988 (WO) ............................. G01N/27/46

* cited by examiner

Primary Examiner—Safet Metjahic
Assistant Examiner—Anjan K Deb
(74) Attorney, Agent, or Firm—Sven W. Hanson; Jacqueline M. Nicol

(57) ABSTRACT

A cell grading test fixture includes an array of cell sockets electrically interconnected in series so that current through the entire array of cells flows through each of the cells once inserted into the fixture. Associated with each socket is an indicator which indicates to the operator when a cell voltage has fallen to a predetermined level. Each socket of the test fixture includes a spring-loaded switch contact such that upon removal of a cell which has dropped below a threshold voltage, the movable contact engages the contact of an adjacent socket, shorting out the cell location such that the series circuit of cells continues to provide a current path for the remaining cells.

27 Claims, 7 Drawing Sheets

BATTERY CELL GRADING HOLDER

BACKGROUND OF THE INVENTION

The present invention relates to a test unit for grading battery cells.

In order to assemble battery packs employing multiple cells made of, for example, a series and/or series parallel connection of individual secondary cells, the cells should have substantially the same capacity. However, NiCd or metal hydride batteries can display different discharge characteristics from one another upon manufacturing. Thus, it is desirable to grade the cells prior to battery pack assembly to assure that the cells have substantially the same capacity, particularly when in a series interconnection, so that one cell, which may have less capacity than the other, does not disable or otherwise reduce the capacity of the entire battery pack.

In the past, in order to grade the cells, a test fixture has been employed for holding cells which have been fully charged, coupling them in series, and loading and discharging them through a resistive load. Such fixtures hold, for example, an array of one hundred cells with the operator inserting the cells into the test fixture to begin their discharge. Periodically, and typically on a two-minute basis, an operator utilizes a voltage test probe to test each cell. The probe provides an audible or visible indication that a cell has fallen below a predetermined reference voltage, such as 1.3 volts for a 1.5 volt cell. Thus, the operator must periodically manually test each of the hundred cells and, if a cell has fallen below the threshold voltage, the test probe will provide the operator with an indication that the cell has reached a lowered voltage. When a cell falls below the threshold voltage, it is then removed, which interrupts the series circuit of the test fixture, and the last most cell is repositioned in the removed cell's location to continue the series discharge circuit. As can be appreciated as more and more cells reach a diminished capacity, the shuffling and reshuffling of batteries becomes a labor intensive and inefficient process by which to grade cells.

SUMMARY OF THE PRESENT INVENTION

In order to overcome the deficiencies of the prior art cell grading process and test equipment, the cell grading test fixture of the present invention includes a plurality of cell sockets for receiving individual cells, with the sockets being electrically interconnected in series so that current through the entire array of cells flows through each of the cells once inserted into the fixture. Associated with each socket is an indicator which indicates to the operator when a cell voltage has fallen to a predetermined level. Each socket of the test fixture includes an electrical contact which is spring-loaded and movable such that upon removal of a cell which has dropped below a threshold voltage, the movable contact engages the contact of an adjacent socket, in effect shorting out the cell location such that the series circuit of cells continues to provide a current path for the remaining cells. A plurality of voltage comparators are coupled to each of the cells and compares the voltage of the cell to a reference voltage. When the cell voltage drops below the predetermined voltage, the indicator, such as an LED mounted to the test fixture immediately adjacent the cell, is illuminated to indicate to the operator that the cell has reached a reduced voltage and should be removed.

Thus, with the cell grading fixture of the present invention, the operator can insert an array of cells for testing and watch the test fixture until such time as cells begin to drop below the threshold voltage, which is indicated by an LED immediately adjacent the individual cell. At such time, the cell is removed and, knowing the time duration it took from the initiation of the testing procedure until the cell reached its lower threshold voltage, the cells can be automatically graded without reshuffling them in the test fixture. Such a test fixture and the method of testing cells greatly improves the efficiency of grading cells and allows a single operator to test multiple cell banks at a given time as opposed to being occupied with the shuffling of cells in a single test fixture.

These and other features, advantages, and objects of the present invention will be further understood and appreciated by those skilled in the art by reference to the following specification, claims, and appended drawings.

DETAILED DESCRIPTION OF THE PREFERRED EMBODIMENTS

Figure 1:
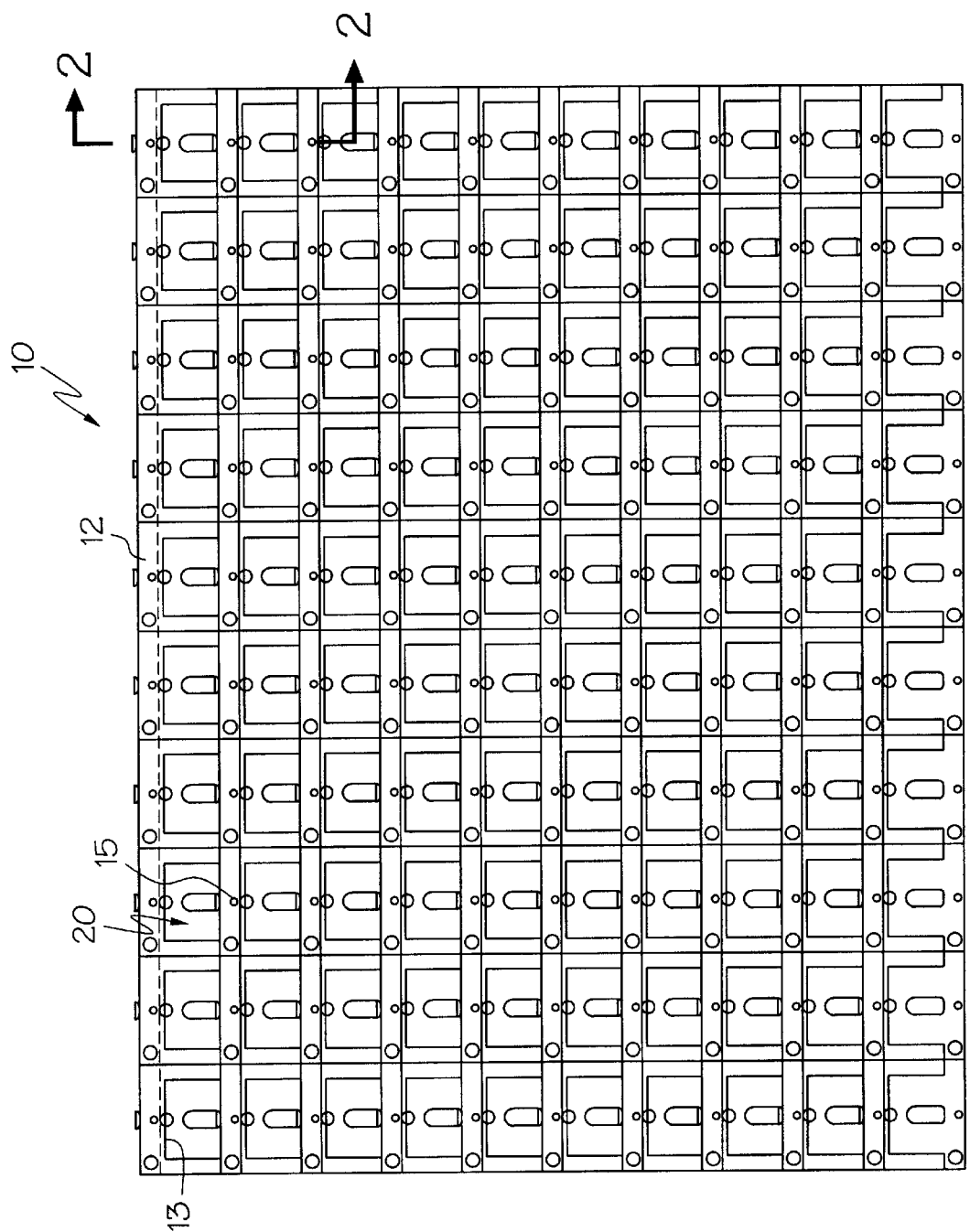
FIG. 1 is a top plan view of a test fixture embodying the present invention.

Referring initially to FIG. 1, there is shown a test fixture for grading cells embodying the present invention. The test fixture 10 comprises a horizontally extending panel 12 supported on a framework sufficient to elevate the panel 12 above a work surface onto which the test fixture is placed. Alternatively, the test fixture could be rack mounted vertically to a suitable framework if desired. The panel 12, in the embodiment illustrated in FIG. 1, includes an array of cell-receiving sockets which have the flexibility of interchanging their shape for use in connection with different cells. For such purpose, the panel 12 includes an array of generally rectangular openings 13 comprising ten rows and columns of such openings for receiving test sockets 20 therein. Thus, the test fixture 10 of the present invention can receive up to one hundred test sockets 20 and be capable of testing up to one hundred cells. With the system of the present invention, however, the array can be decreased or increased for testing a fewer or greater number of cells.

Figure 3:
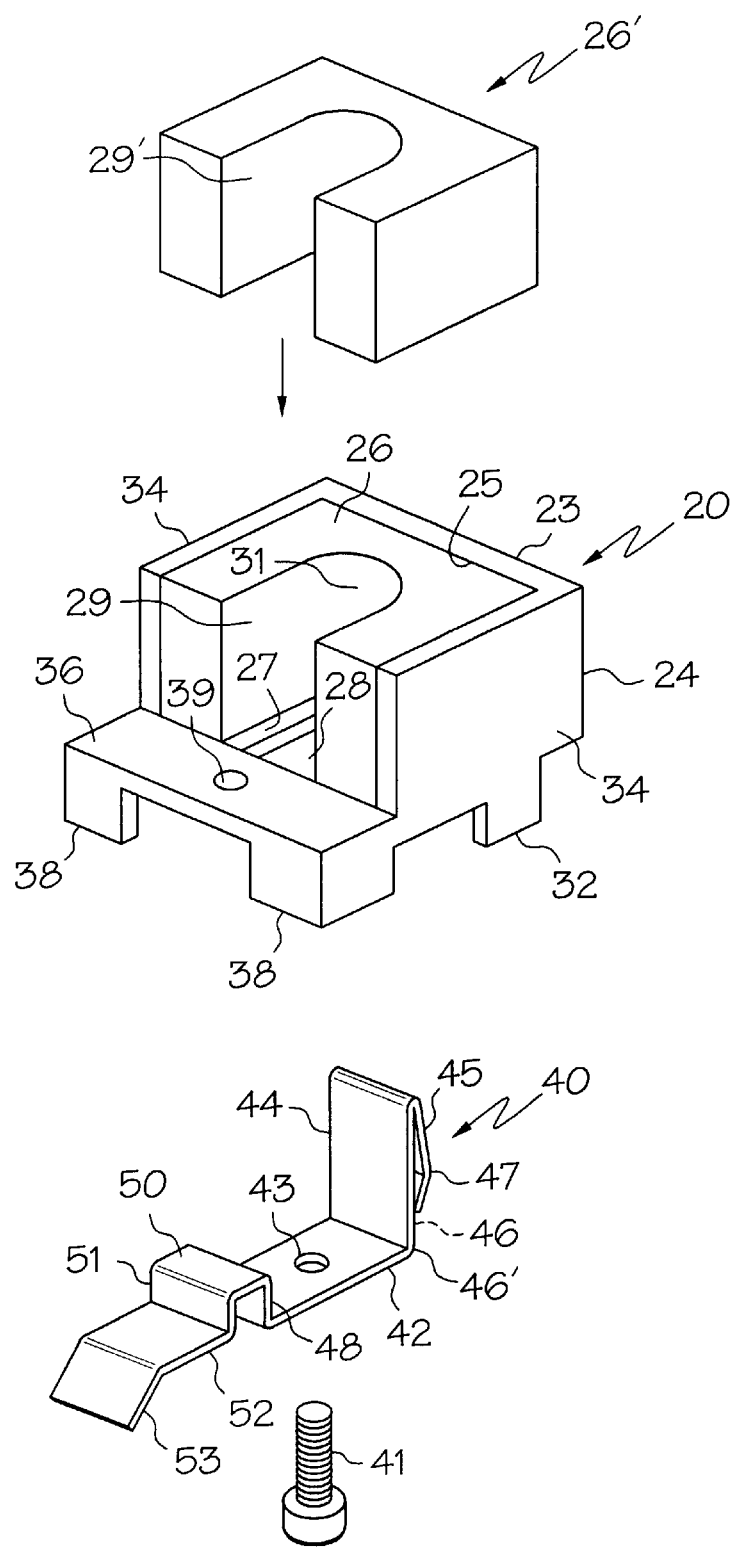
FIG. 3 is an exploded perspective view of one of the cell sockets.
Figure 4:
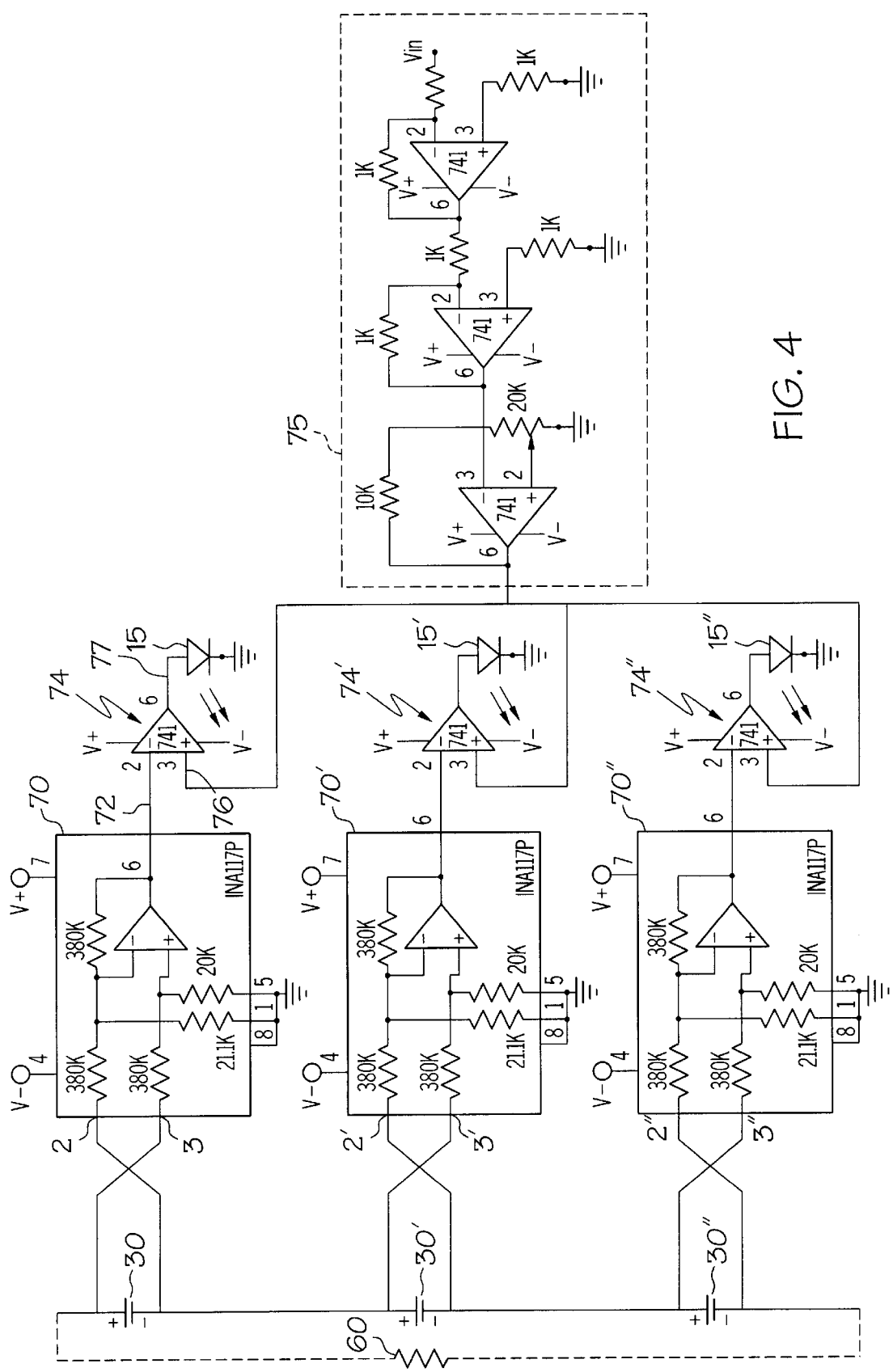
FIG. 4 is a partial electrical circuit diagram for the electrical test circuit employed in connection with the test fixture of FIGS. 1–3.

Mounted to the panel 12 adjacent and below each of the sockets 20 is a light emitting diode (LED) 15 which is coupled to an electrical circuit, shown in FIG. 4. An LED 15 is coupled to each socket and cell being tested for indicating when the cell voltage has fallen below a predetermined reference level. A wiring harness conventionally couples each of the sockets to the test circuit and LED as well as to a suitable resistive load, as shown in FIG. 4, for drawing current through the series coupled cells when under test. The sockets themselves are mechanically and electrically interconnected by the fixture in the manner shown in detail in connection with FIGS. 2 and 3 now described.

Figure 2:
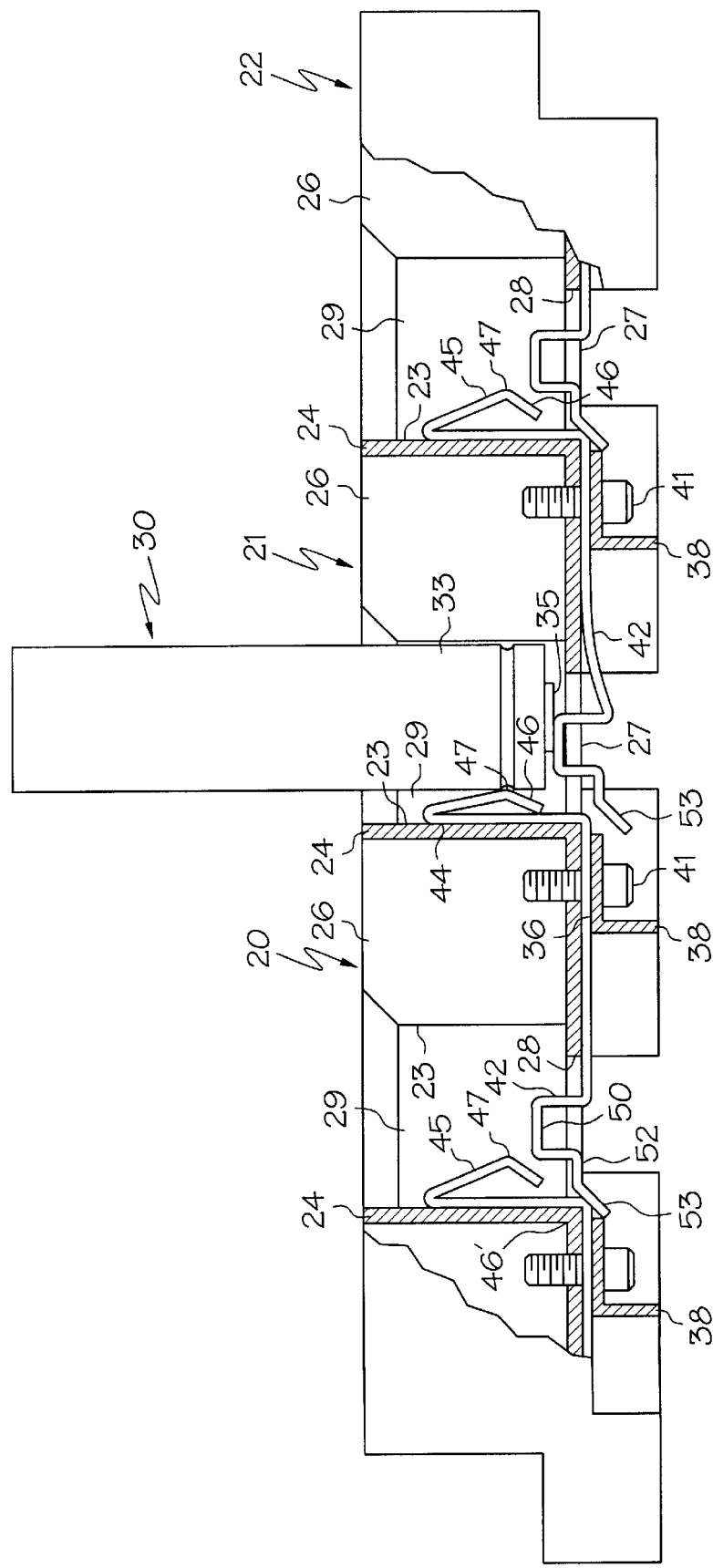
FIG. 2 is an enlarged, fragmentary, vertical, cross-sectional view of a pair of individual sockets in the test fixture shown in FIG. 1.

Referring now to FIG. 2, there is shown three adjacent sockets, such as socket 20 shown in FIG. 1, and adjacent sockets comprising socket 21 having a cell 30 mounted therein and a next adjacent socket 22 of the array of sockets. As can be seen, with reference also to FIG. 3, each of the sockets include a holder 24 with a central recess 25 for receiving a cell adapting insert 26. The generally rectangular recess 25 of the holder 24 includes a floor 27 (FIG. 2) with an opening 28 allowing a configured electrical contact 40 to be mounted and extend within the opening 28 of the holder 24 and opening 29 in adapter 26. Adapter 26 can take on different forms, however, generally comprises a generally U-shaped or rectangular block having opening 29 formed therein with a rounded end 31 generally conforming to the diameter of the cell 30 to be tested such that the cell can easily fit within the opening 29. Other adapters, such as 26' in FIG. 3, having different dimensions for receiving different sized cells, can be employed by insertion into recess 25 of holder 24. The sockets 20, including holders 24 and inserts 26, are made of a suitable insulative material and can be molded of, for example, a polymeric material such as A.B.S., P.V.C., acrylic or the like.

Holder 24 also includes a pair of downwardly projecting tabs 32 extending downwardly from opposite sidewalls 34 for snapping into associated slots in the panel 12. The panel opening 13 provides a sufficient open rectangular area for contacts 40 to be easily accessible from behind the panel 12 and yet receive and hold sockets in place. The socket block 24 also includes a forwardly extending land 36 with downwardly projecting L-shaped corner tabs 38 and an aperture 39 for receiving a fastener 41 for fastening contact 40 to the block. Each of the sockets 20 includes an electrical contact 40 which is adapted to provide a fixed contact associated with the individual socket and a movable contact which selectively engages the fixed contact on an adjacent socket when the sockets are assembled onto the fixture as illustrated in FIGS. 1 and 2. For such purpose, contact 40 includes a base 42 having an aperture 43 through which fastener 41 extends with the width of the base sufficient to bridge the land 36 and position an upwardly projecting end 44 of contact 40 into the aperture 29 of adapter 26 such that it contacts the conductive sidewall 33 of cell 30. For such purpose, the vertically projecting end 44 is bent downwardly at an angle to define a first leg 45 and an integral inwardly curved leg 46 to provide an apex 47 for making contact with the cell sidewall.

Contact 40 also includes, extending from base 42 in a direction opposite contact 44, a U-shaped configured contact 50 defined by spaced vertically extending legs 48 and 51 integral with base 42. Contact 50 engages, as best seen in FIG. 2, the end terminal 35 of a cell 30 when positioned within aperture 29 of a test socket. Contact 50 is movable, as illustrated by the cantilevered mounting through fastener 41 in the central area of base 42 and includes a contact end 53 joined to leg 51 by extension 52. Contact 40 is made of a suitable conductive material, such as beryllium copper, which has excellent conductive properties and yet allows the movable contact 50 to flex, as seen in FIG. 2, in association with cell 30 when the cell is positioned within the aperture 29 and return to a position in which contact end 53 engages the corner 46' of the adjacent contact, as shown in FIG. 2, when the cell is removed, thereby providing a continuous current path across the opened test socket 20 when it does not contain a cell. The opening 28 in the floor 27 of each of the blocks 24 associated with the socket 20 allows the free flexing of movable contact 50, while the fastener 41 holds the apex 47 of the fixed contact in position with respect to the sidewall 23 of aperture 29 and compresses contact 40 into firm mechanical and electrical engagement with the cell wall 33 of a cell, such as cell 30 shown in FIG. 2.

As also shown in FIG. 2, the sockets interfit and nest to provide the array with adjacent contacts 40 engaging both the side of the cell fitted within its socket and the center contact of the cell in an adjacent socket. Thus, as seen in connection with FIGS. 2 and 3, the fixed contact 44 extends upwardly within aperture 29 of a socket and is supported against the end wall 23 of an adjacent socket block while its movable contact 50 extends upwardly through the opening 28 in the same adjacent socket block.

The electrical conductors coupling the test fixture to the circuitry shown in FIG. 4 are terminated by coupling them to contact 40 by a suitable lug position between fastener 41 and aperture 43 in the base 42 of contact 40, thus, providing an electrical contact with each of the cell terminals. The circuitry for providing a reference voltage and loading the cells of the test fixture is shown with reference to FIG. 4.

Shown in FIG. 4 for illustrative purposes are three cells 30, 30' and 30", which are coupled by the test fixture as shown in FIG. 2 in series with one another and the remaining cells of the test fixture across a load resister 60 of FIG. 4. Each of the cell terminals are coupled to an isolation amplifier circuit 70. It being understood, for example, that input 2 of amplifier circuit 70 is coupled to the same fastening screw 41 as input terminal 3' of amplifier circuit 70' utilizing a pair of separate conductors fastened to the same contact, which engages both the negative terminal of cell 30 and the positive terminal of cell 30'. Amplifier circuit 70 provides an output voltage at terminal 72 which represents the cell voltage to which the amplifier is coupled and applies this voltage to one input of a voltage comparator 74. Comparator 74 has a second input coupled to an adjustable reference voltage source 75 set to a threshold of, for example, 1.0 VDC. Comparator 74 receives the voltage from terminal 72 of amplifier circuit 70 and a reference voltage at input terminal 76 from reference voltage source 75, and, when the voltage at terminal 72 falls below the reference voltage at terminal 76, comparator 74 applies a positive voltage at output terminal 77 to power LED 15 associated with the cell 30 and socket into which cell 30 is inserted. Thus, when the voltage across cell 30 falls below a predetermined threshold, LED 15 will be illuminated, and the operator can remove the cell from the test fixture. When this occurs, the movable contact arm 50 moves up such that contact 53 engages apex 46' (FIG. 2) of the cell holder, short circuiting the input terminals of the removed cell location such that the remaining cells continue to discharge.

Thus, with the test fixture 10, illustrated in FIGS. 1–4, up to 100 cells can be simultaneously tested and a visual indication is presented to the operator such that the operator can remove the cells when their voltage falls below a predetermined level. The method by which the cells are graded comprise inserting the cells into the test fixture, switching a load 60 into the series circuit of interconnected cells, and recording the time at which the LED 15 became activated for each cell when removing these cells from the fixture upon activation of the LED indicating the cell has fallen below a predetermined threshold. Utilizing such testing sequence, the relative capacity of the cells can be graded as accurately as desired and individual cells can be grouped for subsequent assembly into battery packs in which it is desired to have cells of substantially similar capacity electrically coupled. As can be appreciated, the array of sockets 20 can be lessened or increased to provide a greater or fewer number of individual testing units for cells and 100 is representative only.

Figure 5:
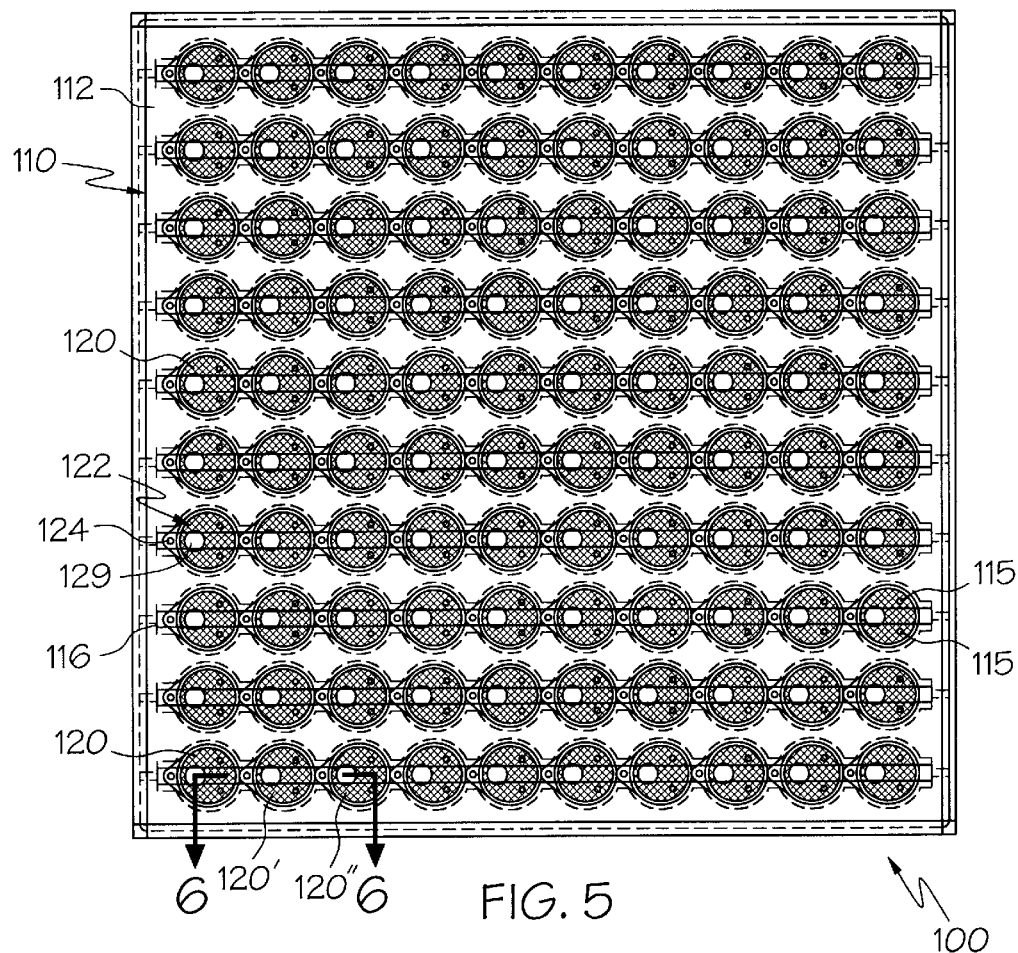
FIG. 5 is a top plan view of a preferred second embodiment of the test fixture.
Figure 7:
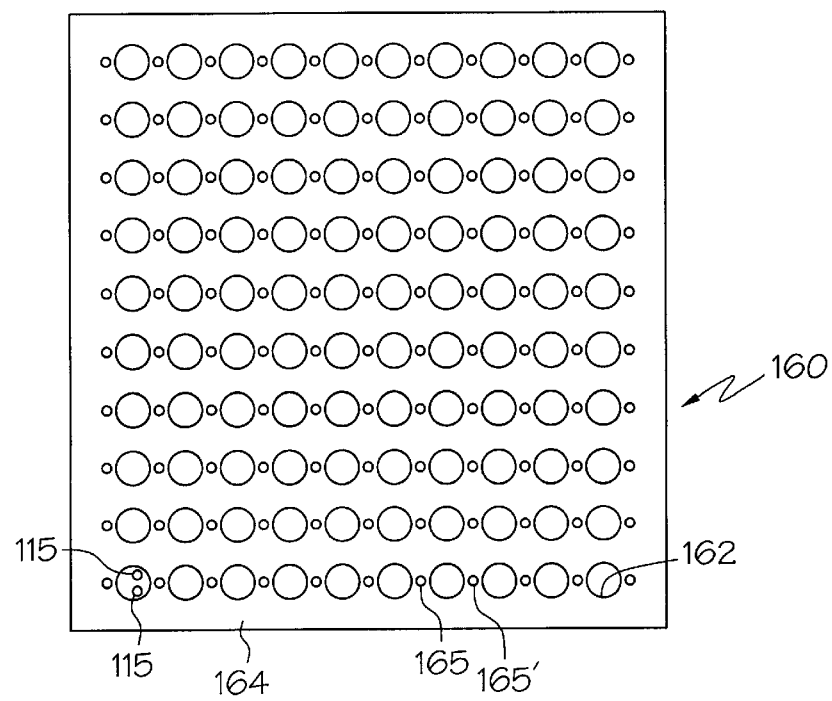
FIG. 7 is a top plan view of the lower plate of the test fixture shown in FIG. 5.
Figure 6:
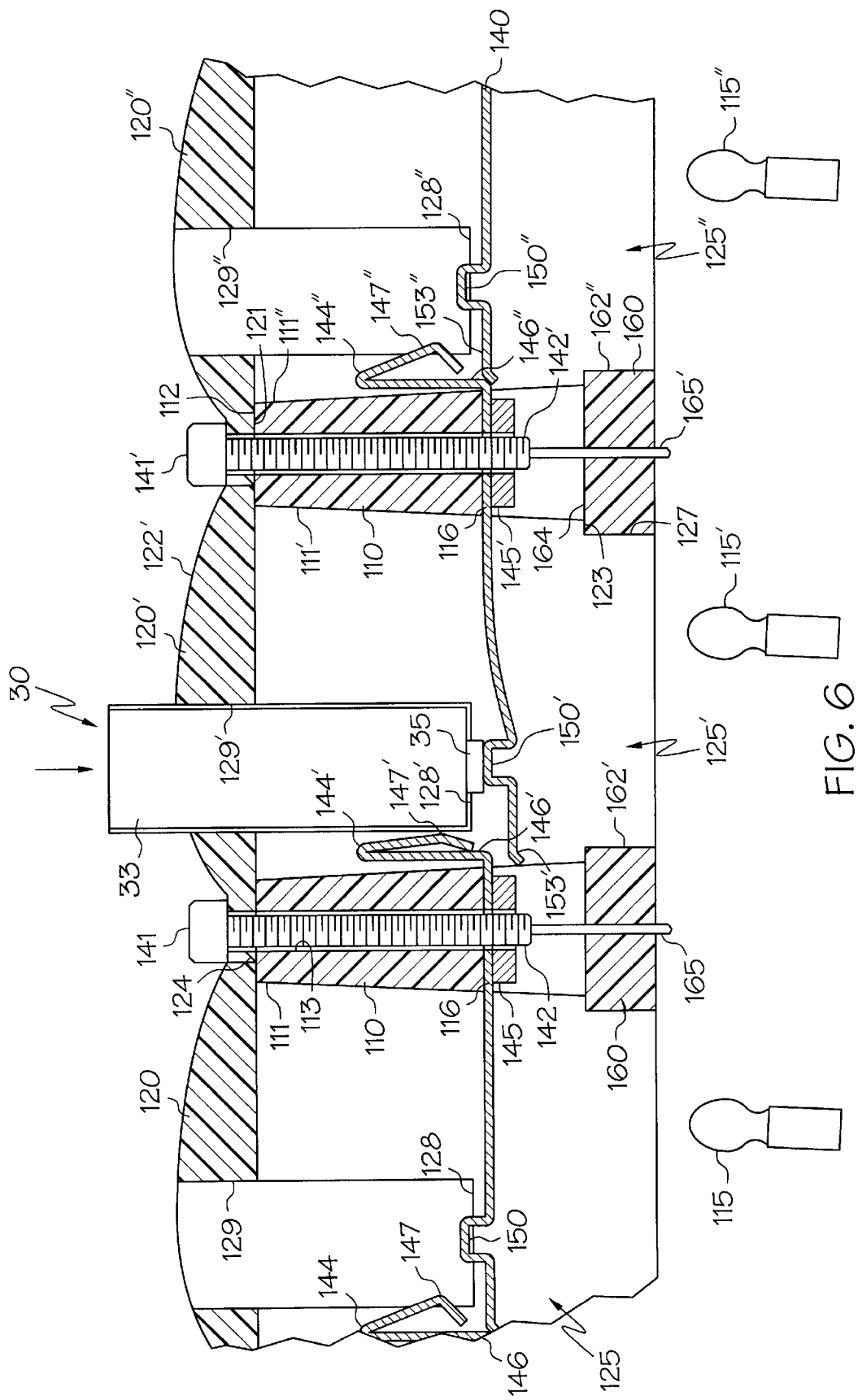
FIG. 6 is an enlarged, fragmentary cross-sectional view taken along plane VI—VI of a few of the individual socket inserts in the test fixture shown in FIG. 5.
Figure 8:
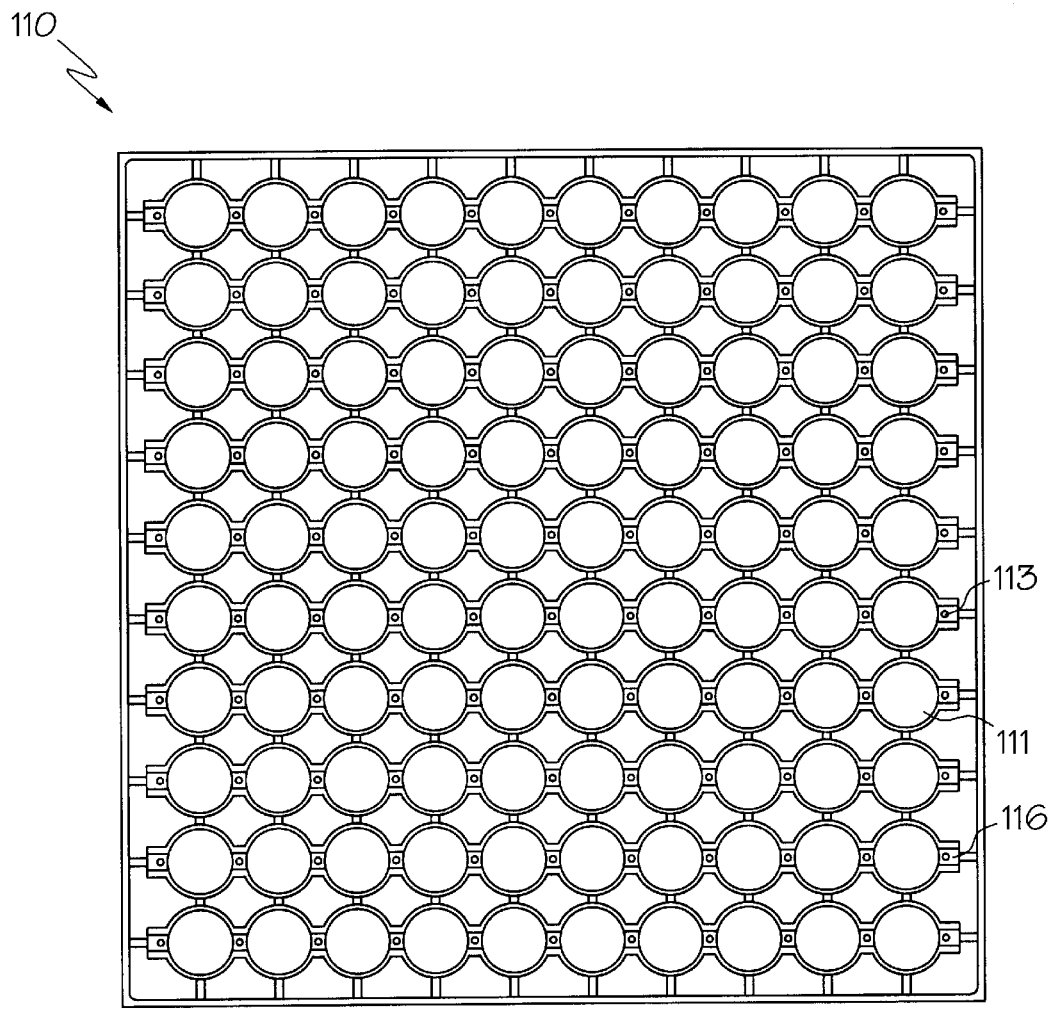
FIG. 8 is a bottom plan view of the upper plate of the test fixture shown in FIG. 5.

A test fixture according to a second and more preferred embodiment is shown in FIGS. 5–9. Test fixture 100 is similar in principle to the first embodiment shown in FIGS. 1–4 except that cell blocks 24 are integrated into a single upper plate 110 that includes a plurality of holes 111 (FIG. 8) for receiving a plurality of transparent socket inserts 120. As shown in FIGS. 5 and 8, each row of holes 111 in the bottom surface of upper plate 110 has an elevated ridge 116 to which electrical connectors are secured that are similar in construction to those used in the first embodiment. Specifically, as shown in FIG. 6, electrical connector 140 includes a vertically projecting end 144 (144', 144") that is bent upwardly to define a curved contact shoulder 146 (146', 146"). Vertically projecting end 1144 is also bent downwardly at an angle to provide an apex 147 (147', 147") for making contact with the side wall 33 of a cell 30. Connector 140 also includes a U-shaped configured contact 150 (150', 150") that, as best shown in FIG. 6, engages the end terminal 35 of cell 30 when positioned within an aperture 129 (129', 129") of a test socket 120 (120', 120"). Contact 150 is movable as illustrated by the cantilevered mounting through a fastener 141 (141'). Further, connector 140 includes a contact end 153 opposite vertically projecting end 144 for contacting curved contact shoulder 146 of an adjacent connector 140.

Figure 9:
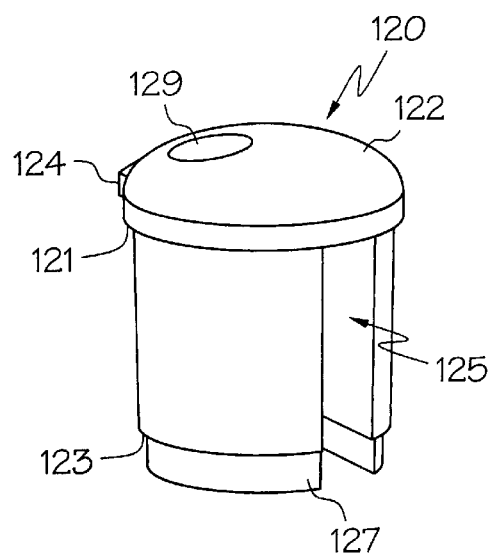
FIG. 9 is a perspective view of a socket insert of the test fixture shown in FIG. 5.

As shown in FIGS. 6 and 9, sockets 120 (120', 120") include a vertical central slot 125 for straddling electrical connectors 140 that run down the length of each row of holes 111 in upper plate 110. Each of inserts 120 includes an aperture 129 into which a cell 30 may be inserted. The size of aperture 129 may vary depending upon the size of the cell to be inserted and graded. Aperture 129 preferably includes a bottom shelf 128 which contacts the crimp area 34 of a cell 30 when fully inserted into aperture 129. In this manner, bottom shelf 128 acts as a stop to limit the depth of insertion of a cell 30 into socket 120.

Sockets 120 also preferably include a dome-shaped upper surface 122. By forming each socket 120 out of a transparent material and forming upper surface 122 in a dome shape, light may be projected upward from light sources 115 (FIG. 6) through each socket 120 so as to be projected outward from the top surface 122 of socket 120. Thus, when one of light sources 115 is illuminated, the operator will have no difficulty determining which light sources are associated with which of the cells being graded. In addition to having a dome shape, upper surface 122 of each socket 120 may be etched so as to diffuse the light transmitted therethrough.

The diameter of the upper portion of each of sockets 120 is preferably larger than the diameter of each of holes 111 such that a ledge 121 formed about the bottom periphery of the upper portion of each socket 120 rests upon the upper surface 112 of upper plate 110. The upper portion of each socket 120 also includes a flat horizontal projection 124 having an aperture that lines up with an aperture 113 formed in upper plate 110 for receiving a fastener 141. Fastener 141 may be a bolt or screw that not only serves to hold sockets 120 in place on upper plate 110, but also holds electrical connectors 140 up against the bottom of ridge 116. To secure fastener 141, a nut 145 may be provided, or the apertures in one or more of upper plate 110, socket 120, or electrical connector 140 may be threaded.

The assembly of the upper plate 110, sockets 120, and electrical connectors 140 is then preferably placed over a bottom plate 160, which has a plurality of corresponding holes 162 for receiving a bottom portion 127 of each socket 120. As shown in FIG. 9, the bottom portion 127 of each socket 120 may have a smaller diameter than the remaining portion of socket 120 so as to define a shoulder 123 that may rest upon an upper surface 164 of lower plate 160. Preferably, the electrical circuitry shown in FIG. 4 is mounted beneath lower plate 160 with one or two light sources 115 per hole 162 mounted below lower plate 160 so as to project light upward through holes 162 and through a corresponding socket 120. To enable electronic circuitry to read the voltages across each cell 30, pogo pins 165 are provided that extend through an aperture provided between each of holes 162 so as to contact a bottom end 142 of fastener 141. Alternatively, pogo pins 165 may directly contact portions of electrical connectors 140. Pogo pins 165 are then coupled to the amplifier circuits (70) of the circuitry shown in FIG. 4.

By utilizing a combination of an upper plate 110 and a lower plate 160, the upper plate assembly 110 and sockets 120 may be loaded with cells 30 prior to being loaded upon lower plate 160. In this manner, cells may be loaded into the sockets 120 of one upper plate 110 while another set of cells in another upper plate assembly are being discharged and graded on the lower plate assembly 160. Then, when the cells are finished being graded, one may simply lift the upper assembly off of lower plate 160 and drop a different upper assembly onto lower plate 160 so as to speed up the grading process of these mass-produced cells.

Also, load 60 (FIG. 4) may be provided as part of the lower plate assembly 160 so as to become connected across each row of connectors 140 when an upper plate assembly is placed on the lower plate assembly. Further, by not permanently connecting load 60 to connectors 140 as part of the upper plate assembly, the cells placed in the upper plate assembly may be simultaneously charged by placing the upper plate assembly on a charging lower plate assembly.

The above description is considered that of the preferred embodiments only. Modifications of the invention will occur to those skilled in the art and to those who make or zuse the invention. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

The invention claimed is:

1. A test fixture for grading battery cells comprising:
   an array of cell-receiving sockets for receiving individual cells;
   an indicator associated with each socket; and
   an electrical circuit coupled to each of said sockets and said associated indicators for activating an indicator when the voltage of a cell inserted into the socket associated with said indicator reaches a predetermined level;
   said electrical circuit including an electrical contact for each socket, said contact comprising fixed and movable sections, said contact mounted to said socket such that when a cell is removed from said socket, said movable contact section moves to complete said electrical circuit.

2. The test fixture as defined in claim 1 wherein said indicator is a light.

3. The test fixture as defined in claim 2 wherein said light is an LED.

4. The test fixture as defined in claim 1 wherein each of said sockets include a cell-receiving recess and said electrical circuit includes a contact mounted to each socket, each of said contacts comprising a generally L-shaped member having a vertically extending fixed contact extending into said recess and a generally horizontally extending movable contact.

5. The test fixture as defined in claim 4 wherein said movable contact engages the fixed contact of an adjacent socket when a cell is removed to complete the circuit vacated by the cell.

6. The test fixture as defined in claim 5 wherein said contact is made of a resilient conductive material.

7. The test fixture as defined in claim 4 wherein said contact is made of beryllium copper.

8. The test fixture as defined in claim 7 wherein each of said sockets are made of a polymeric material.

9. The test fixture as defined in claim 1 wherein said circuit includes a plurality of comparator circuits, each copnarator circuit coupled to one of said sockets, and a reference voltage source coupled to each of said comparators such that each comparator circuit compares the voltage of said reference voltage source and the voltage of a cell inserted into the socket coupled to the comparator circuit.

10. The test fixture as defined in claim 9 wherein said indicator is an LED coupled to each comparator and illuminated by signal from said comparator when a cell voltage falls below a predetermined reference level.

11. A test fixture for grading battery cells comprising:
    an array of cell-receiving sockets for receiving individual cells, each of said sockets including an insert having a recess shaped to receive a corresponding cell shape;
    an indicator associated with each socket; and
    an electrical circuit coupling each of said sockets in series with one another and coupled to said associated indicators for activating an indicator when the voltage of a cell inserted into the socket associated with said indicator falls below a predetermined level; and
    each of said sockets also includes an electrical switch contact with a movable element to close the circuit past the socket when a cell is removed from said socket.

12. The test fixture as defined in claim 11 wherein said movable element engages one terminal of a cell inserted into the socket and the contact of an adjacent socket when the cell is removed.

13. The test fixture as defined in claim 12 wherein said contact is made of a resilient conductive material.

14. The test fixture as defined in claim 13 wherein said contact is made of beryllium copper.

15. The test fixture as defined in claim 14 wherein said array of sockets is made of a polymeric material.

16. The test fixture as defined in claim 11 wherein said electrical circuit includes a plurality of comparator circuits coupled to each of said cells and a reference voltage source coupled to each of said comparators for comparing the voltage between said reference voltage source and each of said cells.

17. The test fixture as defined in claim 16 wherein said indicator is coupled to said comparator for providing a visual indication when the comparator detects that the cell voltage falls below the predetermined reference voltage.

18. The test fixture as defined in claim 11 wherein said indicator includes an LED coupled to each comparator and illuminated by a signal from said comparator when a cell voltage falls below a predetermined reference level.

19. A method of grading a plurality of individual cells comprising the steps of:
    positioning the cells in a test fixture with an array of sockets which include contacts which couple the cells in series when the cells are in position and which short out an individual socket when a cell is removed therefrom;
    applying a load to said cells for drawing current therefrom;
    coupling an electrical circuit to each of said cells for determining when the cell falls below a predetermined threshold voltage;
    providing a visual indication adjacent each cell when such threshold is reached;
    removing a cell when it has reached said threshold voltage; and
    noting the time at which each cell in the fixture has reached its predetermined threshold voltage.

20. A test fixture for grading battery cells comprising:
    an array of sockets for receiving individual cells, each socket including a cell-receiving block having a contact mounted thereto, said block including a recess, a contact-receiving member, a cell-receiving recess, a contact-holding member and a floor with an opening for receiving a contact element therethrough; and
    a contact comprising fixed and movable elements, said contact mounted to said block with said fixed element positioned adjacent said cell-receiving aperture and said movable element extending outwardly from said mounting block to engage a cell through an opening in the floor of an adjacent socket of the test fixture and short out an individual socket when a cell is removed.

21. The test fixture as defined in claim 20 wherein each of said contacts comprises a generally L-shaped member having a vertically extending fixed element and a generally horizontally extending movable element with a base extending therebetween.

22. The test fixture as defined in claim 21 wherein said fixed contact element includes a contact corner at the junction of said base and said vertically extending contact element which is engaged by said movable contact element of an adjacent socket.

23. The test fixture as defined in claim 22 wherein said movable contact element comprises a generally U-shaped member mounted to said base of said socket and including a central section for engaging the center terminal of a cell.

24. The test fixture as defined in claim 23 wherein said movable contact element further includes an extension and a downwardly projecting end for engaging said contact corner of an adjacent socket when a cell is removed from the adjacent socket.

25. The test fixture as defined in claim 24 wherein said contact is made of a resilient conductive material.

26. The test fixture as defined in claim 25 wherein said contact is made of beryllium copper.

27. A test fixture for grading electrochemical cells comprising:
    a support structure having an array of apertures for receiving electrochemical cells; and
    a plurality of electrical conductors each having a fixed contact pad and a movable contact pad, each of said conductors being mounted to said support structure such that said fixed contact pad extends within one of said apertures to contact a first contact terminal of a cell inserted into that aperture and such that said movable contact extends into an adjacent aperture to contact a second tenninal of a cell inserted into the adjacent aperture and to contact a fixed contact pad of an adjacent conductor when a cell is not inserted in the adjacent aperture.

* * * * *